United States Patent
Bezama et al.

(10) Patent No.: US 7,111,797 B2
(45) Date of Patent: Sep. 26, 2006

(54) NON-CONTACT FLUID PARTICLE CLEANER AND METHOD

(75) Inventors: Raschid J. Bezama, Mahopac, NY (US); Nike O. Medahunsi, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 133 days.

(21) Appl. No.: 10/708,736

(22) Filed: Mar. 22, 2004

(65) Prior Publication Data

US 2005/0205699 A1   Sep. 22, 2005

(51) Int. Cl.
*B05B 7/02* (2006.01)
*B08B 3/04* (2006.01)

(52) U.S. Cl. .................... 239/522; 15/302; 15/345; 134/95.2; 134/104.2; 134/902; 137/808; 137/810; 239/468; 239/489; 239/589.1; 239/754

(58) Field of Classification Search ................ 239/522, 239/477, 489, 472, 468, 466, 463, 754, 461, 239/589.1, 595; 137/808, 810, 813, 833; 15/302, 306.1, 309.1, 345; 134/95.2, 104.2, 134/902
See application file for complete search history.

(56) References Cited

U.S. PATENT DOCUMENTS

| | | | | | |
|---|---|---|---|---|---|
| 4,198,061 | A | * | 4/1980 | Dunn | 15/1.51 |
| 5,457,847 | A | * | 10/1995 | Uzawa et al. | 15/345 |
| 5,800,679 | A | * | 9/1998 | Lindstrom et al. | 162/272 |
| 6,052,681 | A | * | 4/2000 | Harvey | 707/3 |
| 6,148,831 | A | * | 11/2000 | Lindstrom et al. | 134/21 |
| 6,449,799 | B1 | * | 9/2002 | Keller | 15/322 |
| 6,474,355 | B1 | * | 11/2002 | Jirawat et al. | 15/306.1 |
| 6,517,640 | B1 | * | 2/2003 | Deng | 134/21 |
| 2005/0044653 | A1 | * | 3/2005 | Wakao et al. | 15/302 |

\* cited by examiner

*Primary Examiner*—Justine R. Yu
*Assistant Examiner*—Jason Boeckmann
(74) *Attorney, Agent, or Firm*—Ira D. Blecker; Hoffman, Warnick & D'Alessandro

(57) ABSTRACT

A fluid particle cleaner and method are disclosed. The invention provides a partition to a side of a fluid nozzle to form: a central cavity configured to define the fluid departing the surface into a central cavity vortex; and a side cavity adjacent the central cavity to define fluid escaping from the central cavity into a side vortex. The vortices interact in a counter-rotating and stationary fashion. The strong and smaller central vortex creates an upward air velocity field that forces any airborne particle to move away from the surface. The side vortex is designed to: connect the central vortex velocity field to the vacuum flow and allow airborne particles to remain suspended until they reach the vacuum flow; and create a decelerating field for high speed particles traveling parallel (horizontally) to the surface to increase the residence time in the central vortex with positive vertical velocity.

20 Claims, 6 Drawing Sheets

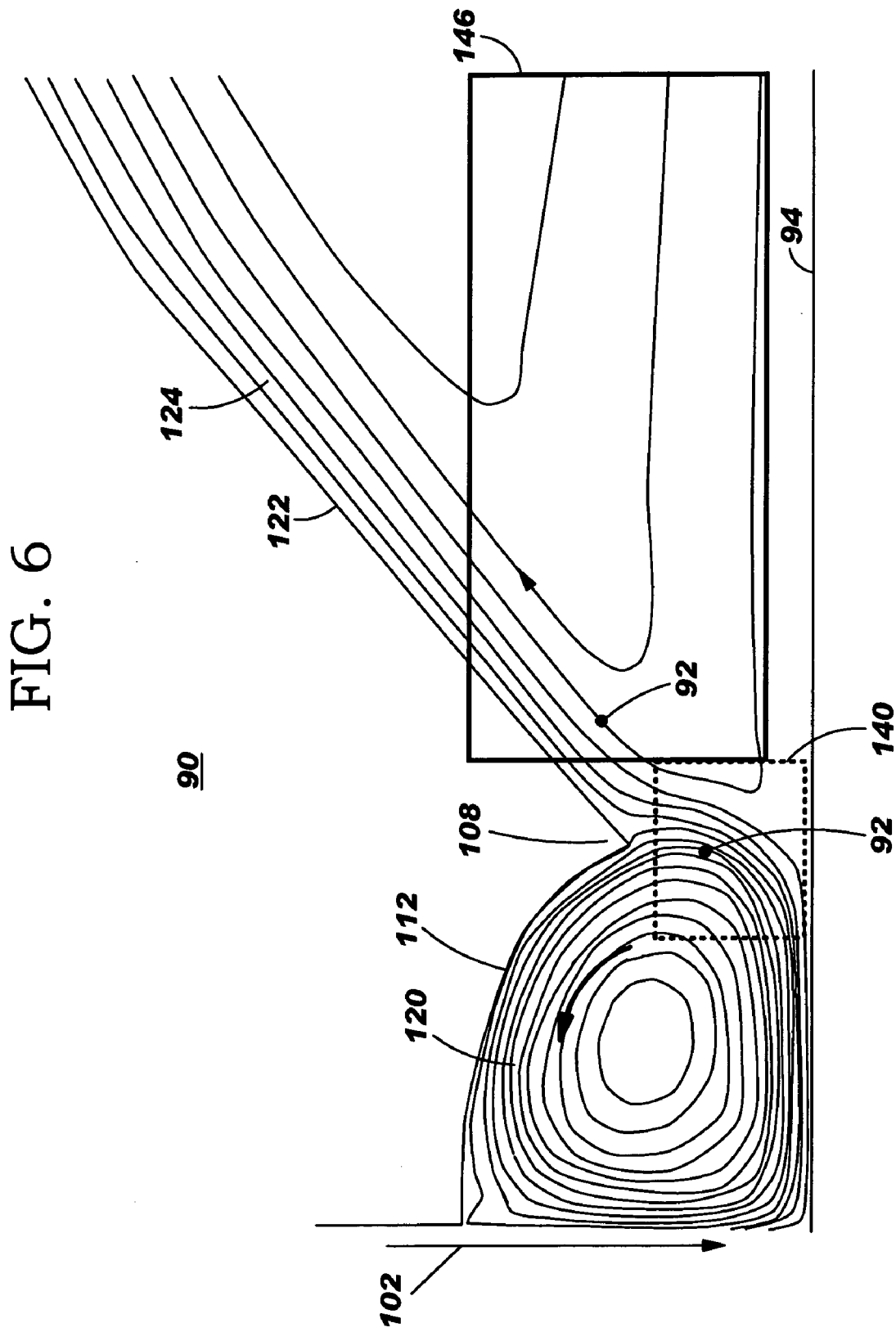

NON-CONTACT FLUID PARTICLE CLEANER AND METHOD

BACKGROUND OF INVENTION

1. Technical Field

The present invention relates generally to fluid jet particle cleaners. More particularly, the present invention relates to a non-contact fluid jet particle cleaner and method that shape fluid vortices to more efficiently remove particles.

2. Related Art

Fluid jet particle cleaners are commonly used to remove minute particles from products in a wide variety of industries. One illustrative industry in which these cleaners find application is the semiconductor industry. In this industry, yields and mask life in a manufacturing line are very sensitive to the presence of small particles that are less than 5 mils in diameter on the product surface. Fluid jet particle cleaners provide a low cost solution to clean the surface of a product.

FIG. 1 illustrates a conventional fluid jet particle cleaner 10 that propels a fluid 12 such as air onto a surface 14 of a product 16 to release particles therefrom, and then vacuums 18 the airstream to remove the particles. While many particles in a given diameter range are removed by cleaner 10, some of the particles escape vacuum 18 flow and fall back onto surface 14 at a different place than where they were originally. FIG. 2 illustrates streamlines for the simulated section indicated in FIG. 1. The streamlines indicate the path a very small particle with low inertia may follow if suspended in fluid 12. The closer the streamlines are to one another, the stronger the vortex. As shown in FIG. 2, escaping particles dislodged form surface 14 by fluid 12 are able to bypass vacuum 18 flow because they are accelerated quickly to high speeds with a large horizontal velocity component by a single air vortex 20 created by the strong fluid jet 12. The elongated bottom of air vortex 20 that contacts surface 14 illustrates this phenomenon. Unfortunately, one or just a few of such escaping particles can have a direct impact on yield and screening process performance in the semiconductor industry.

Another approach implements full contact equipment such as tacky rollers to collect particles. However, this approach is not always applicable to all situations and adds processing cost, product handling steps, and sometimes transfers chemicals to the surface being cleaned.

In view of the foregoing, there is a need in the art for a non-contacting particle cleaner that addresses the problems of the related art.

SUMMARY OF INVENTION

The invention includes a non-contact fluid particle cleaner and method that provides a partition to a side of a fluid nozzle to form: a central cavity configured to define the fluid departing the surface into a central cavity vortex; and a side cavity adjacent the central cavity to define fluid escaping from the central cavity into a side vortex. The vortices interact in a counter-rotating and stationary fashion. The strong and smaller central vortex creates an upward air velocity field that forces any airborne particle to move away from the surface. The side vortex is designed to: connect the central vortex velocity field to a vacuum flow and allow airborne particles to remain suspended until they reach the vacuum flow; and create a decelerating field for high speed particles traveling parallel (horizontally) to the surface to increase the residence time in the central vortex.

A first aspect of the invention is directed to a cleaner for removing particles from a surface by propelling a fluid onto the surface, the cleaner comprising: at least one partition adjacent a fluid nozzle, each partition defining: a central cavity configured to define the fluid departing the surface into a first vortex; and a side cavity adjacent the central cavity configured to define fluid escaping from the central cavity into a second vortex.

A second aspect of the invention is directed to a cleaner for removing particles from a surface by propelling a fluid against the surface, the cleaner comprising: means for delivering a fluid under pressure to an area on the surface; means for forming fluid departing the surface into at least one first vortex adjacent the area and in contact with the surface, and at least one second vortex adjacent each first vortex and in contact with the surface; and means for evacuating particles by removing a part of the second vortex.

A third aspect of the invention is directed to a method for removing particles from a surface by propelling a fluid against the surface, the method comprising the steps of: delivering a fluid under pressure to an area on the surface; forming fluid departing the surface into at least one first vortex adjacent the area and in contact with the surface, and at least one second vortex adjacent each first vortex and in contact with the surface; and removing particles by removing at least part of the second vortex.

The foregoing and other features of the invention will be apparent from the following more particular description of embodiments of the invention.

BRIEF DESCRIPTION OF DRAWINGS

The embodiments of this invention will be described in detail, with reference to the following figures, wherein like designations denote like elements, and wherein:

FIG. 6 shows an exploded view of part of FIG. 5 including fluid streamlines.

DETAILED DESCRIPTION

Figure 3:
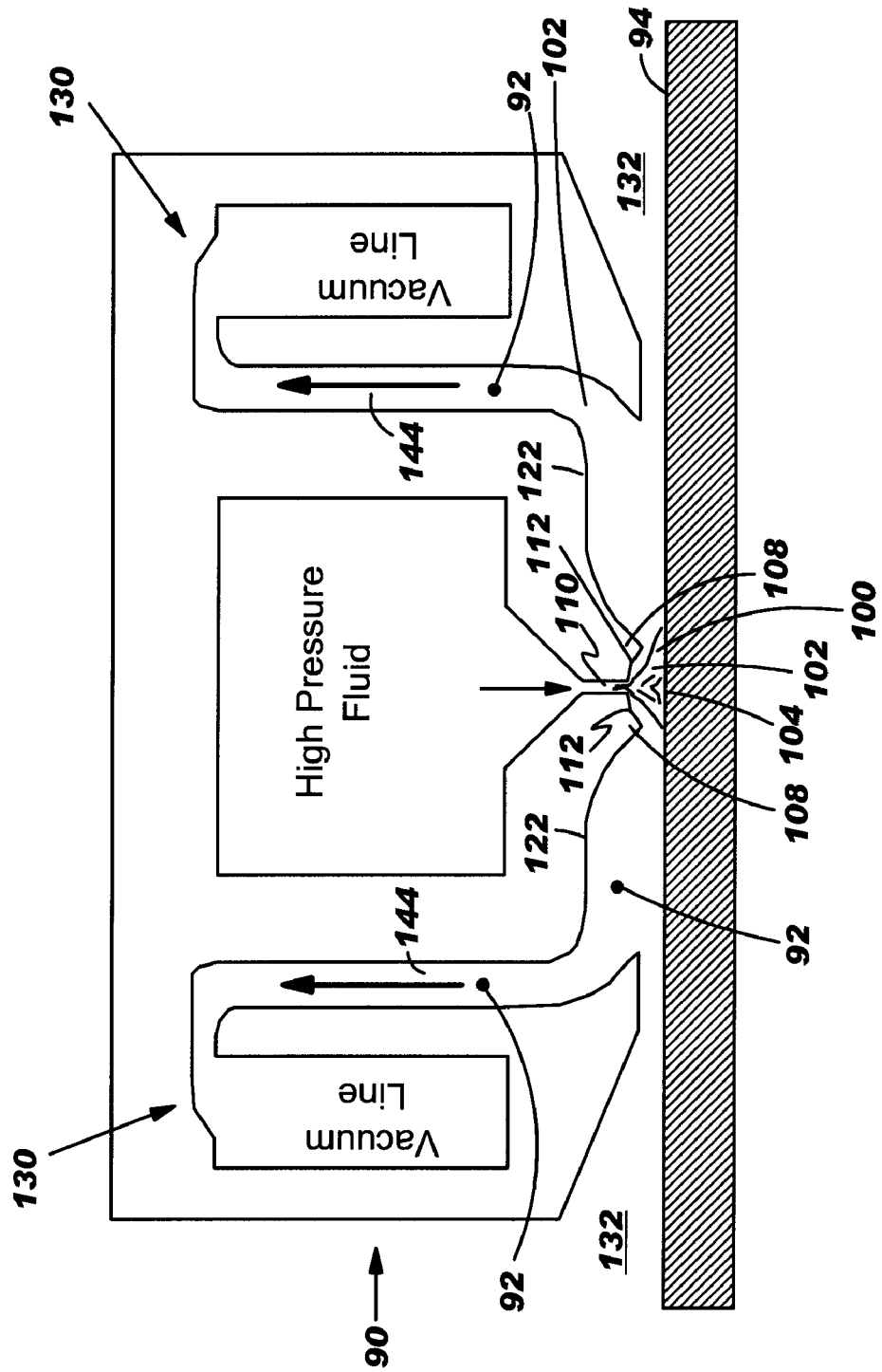
FIG. 3 shows a cleaner according to the invention.

With reference to the accompanying drawings, FIG. 3 illustrates a cleaner 90 for non-contacting removal of particles 92 from a surface 94 by propelling a fluid 100 (via a fluid jet 102) onto a jet contact area 104 of surface 94 according to the invention. Cleaner 90 includes at least one partition 108 adjacent a fluid nozzle 110 that when cleaner 90 is in close proximity to surface 94, defines cavities where fluid 100 can circulate in a predetermined flow pattern that is efficient to remove particles from surface 94. Cleaner 90 does not contact surface 94, and may be, for example, 10–40 mils away from surface 94. For purposes of clarity, the fluid upon with which the invention is described is air. It should be recognized, however, that the teachings of the invention are modifiable to apply to any fluid including, for example, gases and/or liquids. In one embodiment, cleaner 90 is constructed such that it extends in a planar fashion, i.e., into and out of the page, such that fluid 100 contacts surface 94 as a planar shape.

Fluid nozzle 110 propels the fluid substantially perpendicular onto surface 94 at a high pressure, which depends on the fluid, e.g., for air: 10–30 psi, and lower for a liquid. The primary job of fluid jet 102 is to dislodge particles 92 from surface 94. Since the force transferred from the fluid velocity field to a particle 92 is proportional to the square of the local velocity around the particle, the point where the maximum force is applied to the particle is expected to be between 2 and 5 fluid nozzle diameters ($d_j$) away from fluid jet 102 centerline on surface 94, where fluid jet 102 boundary layer thickness is the smallest. Once a particle 92 is dislodged and airborne, it has an initially low forward velocity. As a particle 92 moves away from the initial point of separation from surface 94, the particle is accelerated away from fluid jet 102 centerline by a horizontal velocity field.

Figure 4:
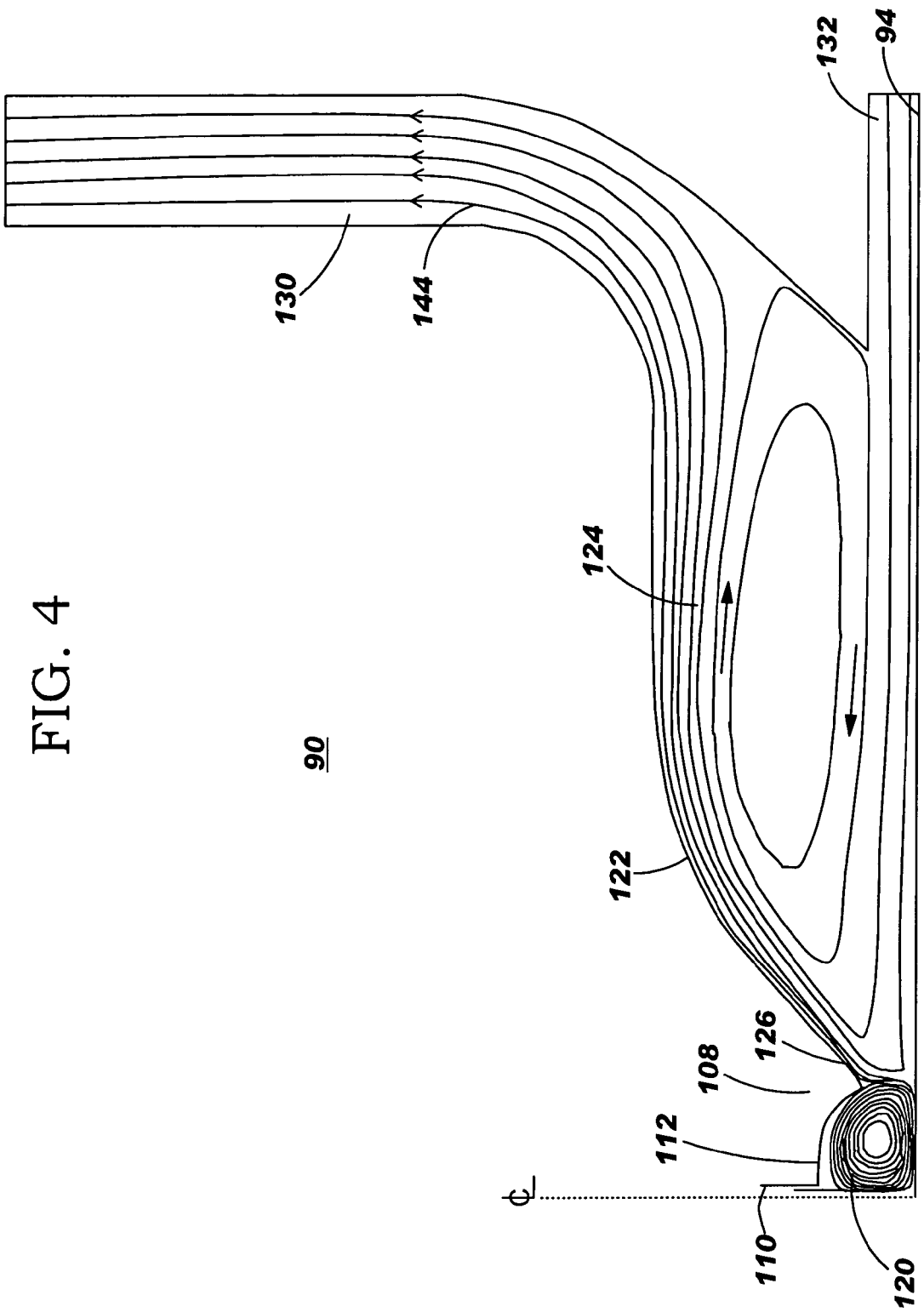
FIG. 4 shows a view of the cleaner of FIG. 3 as partitioned through a centerline and including fluid streamlines.

FIG. 4 illustrates a view of cleaner 90 as partitioned through the centerline of fluid nozzle 110 and including fluid streamlines. Although cleaner 90 preferably includes two partitions 108, one to each side of fluid nozzle 110 as shown in FIG. 3, the cleaner can be constructed as shown in FIG. 4 with only one partition, if desired. As shown in FIGS. 3 and 4, each partition 108 defines a central cavity 112 configured to define fluid 100 departing surface 94 into a first or central vortex 120 (FIGS. 4 and 6 only), and a side cavity 122 adjacent to central cavity 112 configured to define fluid 126 escaping from central cavity 112 into a second or side vortex 124 (FIGS. 4 and 6 only), which interacts with central vortex 120. Each partition 108 and cavities 112, 122 are shaped to modulate the momentum exchange between fluid 100 circulating in central cavity 112 and side cavity (ies) 122 to generate a pair of counter-rotating air vortices 120, 124 at each side of fluid jet 102.

As shown best in FIGS. 3 and 4, each side cavity 122 is coupled to a vacuum 130 to evacuate or remove at least part of second vortex 124 to remove particles 92. It is preferable that a vacuum flow velocity $V_{vac}$ is greater than the terminal velocity $V_{dp}$ of a particle of interest with the largest diameter, i.e., $V_{vac} > V_{dp}$. Since cleaner 90 does not contact surface 94, some escaping fluid 126 (FIG. 4 only) can escape to a surrounding area 132 of cleaner 90 when fluid nozzle 110 delivery volume ($Q_{jet}$) is greater than vacuum 130 volume ($Q_{vac}$).

Figure 1:
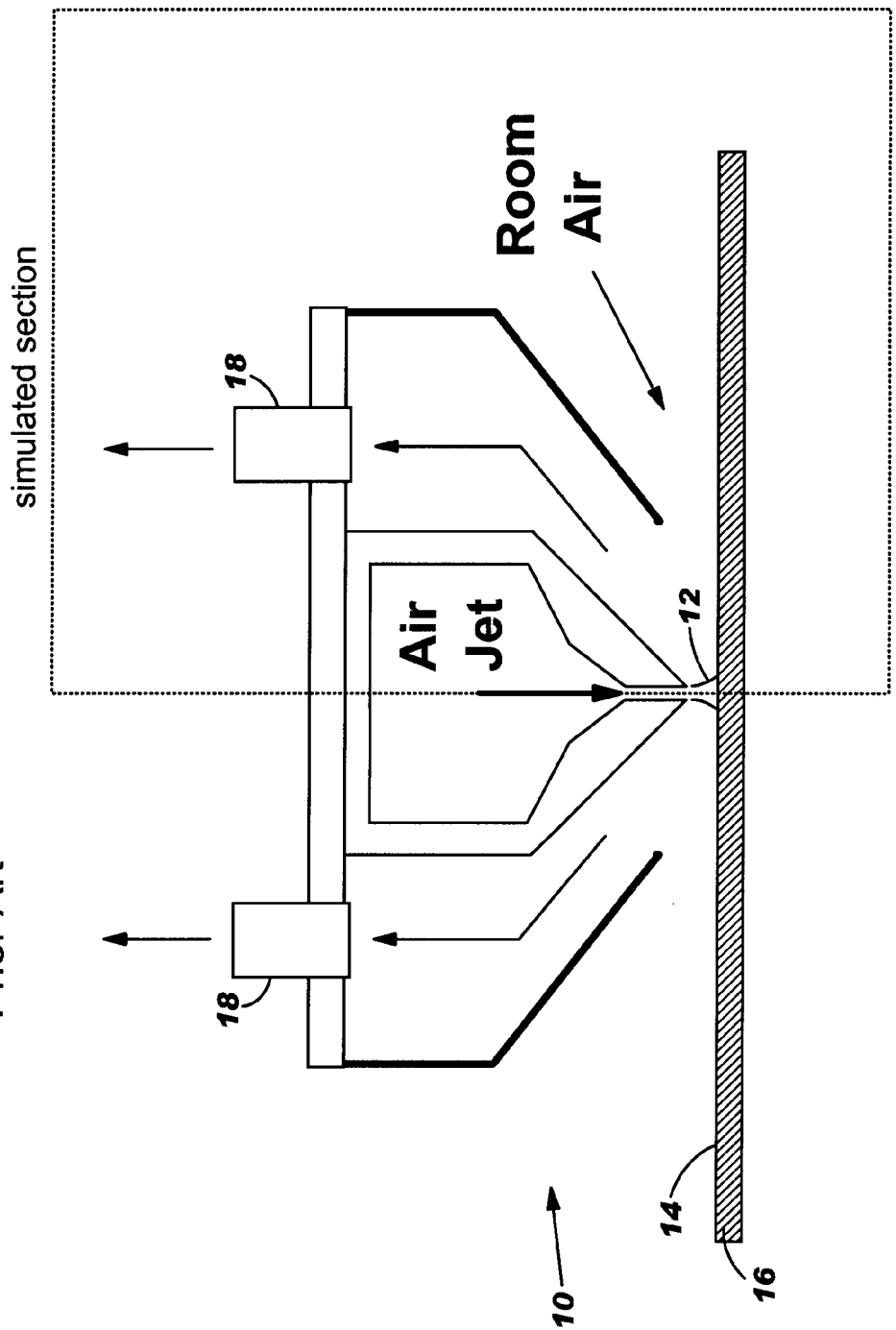
FIG. 1 shows a conventional fluid jet particle cleaner.
Figure 2:
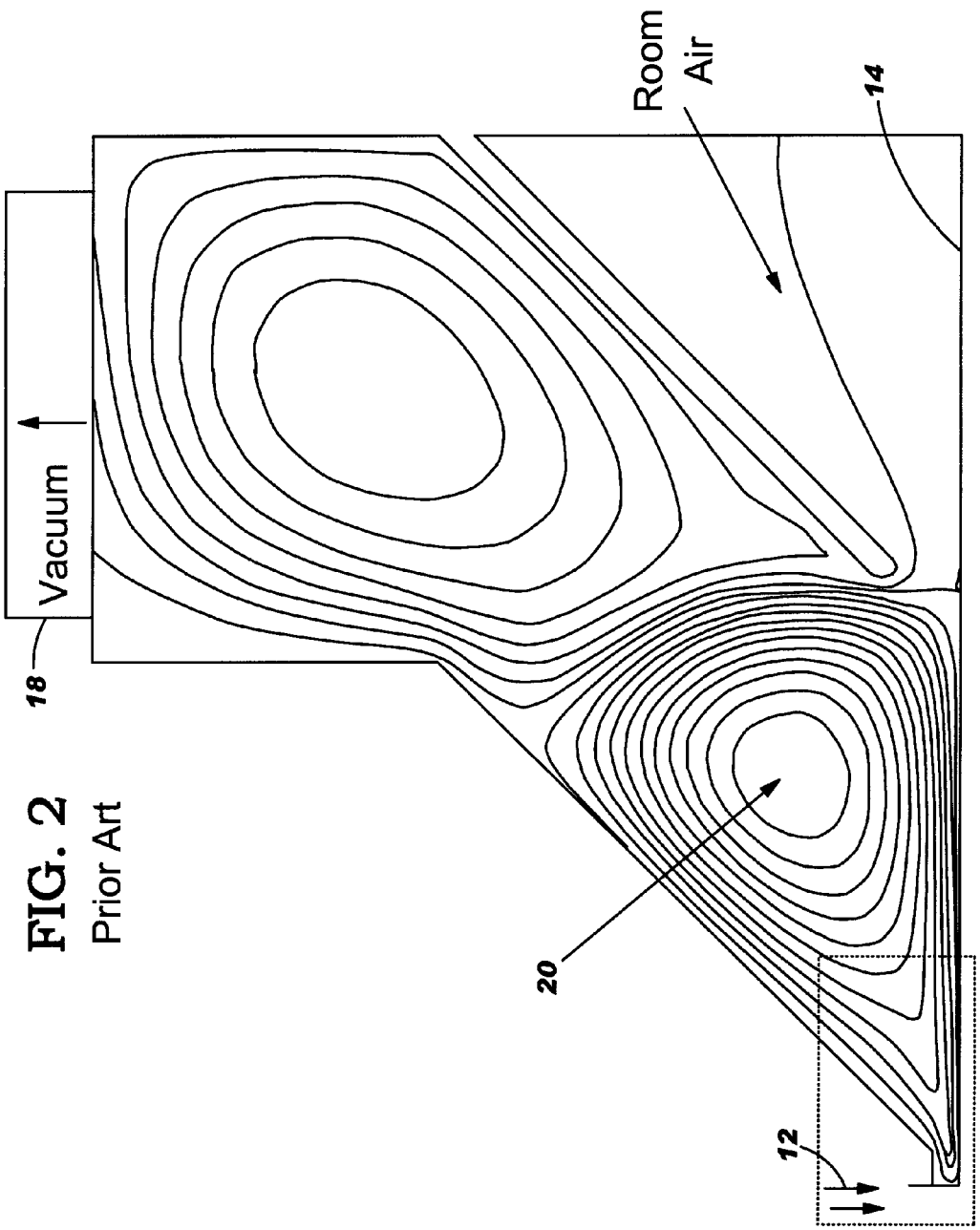
FIG. 2 shows streamlines for a simulated section of FIG. 1.

As noted above, each partition 108 forms the two interacting and counter-rotating stationary fluid vortices 120, 124 of different size, i.e., diameter, and different energy in the same place where a conventional cleaner (FIGS. 1–2) provides only a single fluid vortex. That is, each partition 108 forms fluid 100 departing surface 94 into at least one first vortex 120 adjacent to jet contact area 104 and in contact with surface 94, and at least one second vortex 124 adjacent to each first vortex 120 and in contact with surface 94. The rotation of fluid in central cavity 112 is defined by the direction of fluid jet 102, as the jet exchanges momentum with its surroundings, i.e., surface 94 and cavity 112. In particular, central vortex 110 is relatively strong and small, and is formed adjacent fluid jet 102, while side vortex 124 is weaker and is larger and is formed away from fluid jet 100.

Figure 5:
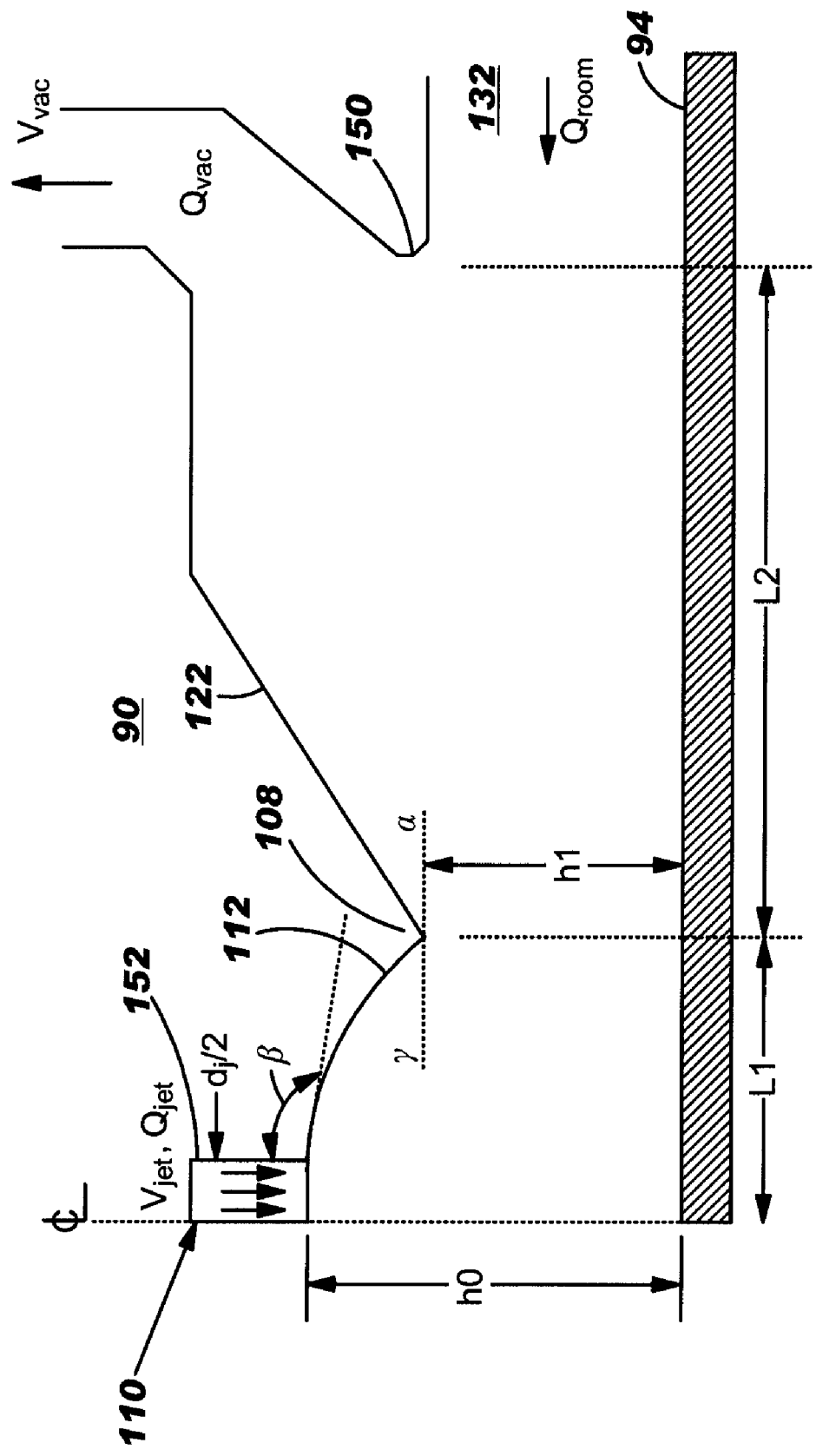
FIG. 5 shows a view of the cleaner of FIG. 4 including geometric characteristics.

Details of cavities 112 and 122 and vortices 120 and 124 will now be described relative to FIGS. 5 and 6. FIG. 5 shows a number of cleaner 90 geometric characteristics and operational parameters. To begin with, in terms of geometric characteristics, each partition 108 is distanced from surface 94 by a partition distance h1, and fluid nozzle 110 is distanced from surface 94 by a nozzle standoff distance h0.

FIG. 6 shows details of fluid streamlines near each partition 108. In FIG. 6 (and FIG. 4), line density indicates vortex strength.

As shown in FIG. 6, each central vortex 120 is configured to create a short upward air velocity field 140, which forces any airborne particle 92 to move away from surface 94. In order to provide this function, central cavity 112 is made to promote the formation of central vortex 120 (adjacent to the planar fluid jet 102) while minimizing the potential for vortex 120 to extend its circulation range outside central cavity 112. In this manner, each central vortex 120 provides an accelerating and lifting velocity field 140 to the dislodged and airborne particles 92. In contrast, standard devices only provide a horizontally accelerating velocity field (see FIG. 2). To accomplish this, regardless of fluid used, it is preferable that a Reynolds number (Re) based on a fluid velocity ($V_{jet}$) (FIG. 5) as a reference velocity and partition distance h1 (FIG. 5) as a reference distance is preferably no less than 7,500 and no greater than 20,000, i.e., $7,500 < Re(V_{jet}, h1) < 20,000$. Above this range, each central vortex 120 has sufficient energy to extend its circulation range outside central cavity 112 and then fail to develop an adequate particle lifting velocity field. Below this range, the strength of central vortex 120 is too low to form an adequate strength side vortex 124.

Each side vortex 124 is designed to provide two functions. First, as shown in FIG. 4, each side vortex 124 connects central vortex 120 field to vacuum flow 144 of vacuum 130 and allows airborne particles 92 to remain suspended until they reach the vacuum flow 144. Second, as shown in FIG. 6, once fluid-borne particles 92 leave central cavity 112 and enter side cavity 122, they have both a horizontal and a lifting vertical velocity component via accelerating and lifting velocity field 140. The former, if left unchecked, may lead to particles escaping from under cleaner 90. In order to address this problem, each side vortex 124 contacts surface 94 and creates a lifting and mildly decelerating field 146 for high speed particles 92 that would normally be traveling parallel to surface 94. As a result, side vortex 124 increases the residence time of particles 92 in accelerating and lifting velocity field 140. This second function greatly reduces or eliminates the risk of a particle escaping capture. Lifting and mildly decelerating field 146 can be generated in side cavity 122 by controlling the momentum exchange between central vortex 120 and side cavity 122. This control is possible when central cavity 112 has a Reynolds number greater than 7500. In addition, the shape of side cavity 122 near partition 108 should meet certain geometric characteristics (described below) that depend on particular flow rate parameters, particle diameter/type range of interest and fluid-specific dynamics.

Referring to FIG. 5, illustrative geometric and operational characteristics of cleaner 90 for the illustrative embodiment using air as a fluid will now be described. For this illustrative embodiment, the following geometric characteristics have been found advantageous:

A) Partition distance h1 is preferably less than a distance L1 from a centerline (CL) of fluid nozzle 102 to partition 108, i.e., h1 < L1.

B) Nozzle standoff distance h0 is preferably no less than 1.2 times partition distance h1 and no greater than twice partition distance h1. That is, $1.2h1 < h0 < 2.0h1$.

C) Distance L1 from centerline (CL) of fluid nozzle 110 to each partition 108 is preferably greater than five times an inner diameter $d_j$ of fluid nozzle 110, i.e., $L1 > 5.0 d_j$.

D) A ratio of a lateral distance L2 of each side cavity 122 between partition 108 and a vacuum entry 150 to partition distance h1 is preferably greater than 10, i.e., L2/h1>10.0.

E) Central cavity 112 forms an angle $\gamma$ with the horizontal at each partition 108 of greater than 0° and less than 65°, i.e., 0°<$\gamma$<65°.

F) Each side cavity 122 forms an angle $\alpha$ with the horizontal at each partition 108 of no less than 20° and no greater than 90°, i.e., 20°<$\alpha$<90°.

G) Central cavity 112 forms an angle $\beta$ relative to a vertical edge 152 of fluid nozzle 110 of no less than 80° and no greater than 135°, i.e., 80°<$\beta$<135°.

Furthermore, in addition to the above-described Reynold's number range, the following operational characteristic have been found advantageous: vacuum 130 volume $Q_{vac}$ is greater than 90% of fluid nozzle 110 delivery volume $Q_{jet}$, i.e., $Q_{vac}$>0.9$Q_{jet}$.

It should be understood that actual geometric characteristics will be particular to a specified fluid, particle size/type and desired flow parameters. Accordingly, the relative size of the device may vary and all sizes are considered within the scope of the invention.

The invention also includes a method for removing particles from a surface by propelling a fluid against the surface. The method includes: delivering a fluid 100 under pressure to an area 104 on surface 94; forming fluid departing surface 94 into at least one first vortex 120 adjacent area 104 and in contact with surface 94, and at least one second vortex 124 adjacent each first vortex 120 and in contact with surface 94; and removing particles 92 by removing at least part of each second vortex 124.

While the invention has been described with one partition 108 to each side of fluid nozzle 110, to provide a balanced functioning of vortices, etc., it should be recognized that additional partition(s) 108 to generate further air vortices can be provided depending on desired flow rates, particle diameter/type range of interest and fluid-specific dynamics. In this case, however, an addition vacuum for each new cavity may be necessary. In addition, while cleaner 110 has been shown placed above surface 94, it should be recognized that placement below surface 94, or above and below surface 94 is also possible. In practice, the process of removing particles 92 from surface 94 is more demanding in when cleaner 90 is above surface 94 because the dislodged particle to be removed must be lifted against the gravity field. Accordingly, the process efficiency will be directly dependent on particle size and density in addition to the velocity of the vortices. Where cleaner 90 is below surface 94, the gravity field helps remove the particle from the surface once a particle is dislodged from the surface, hence only the velocity of the vortices is important.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. A cleaner for removing particles from a surface by propelling a fluid onto the surface, the cleaner comprising:
at least one partition adjacent a fluid nozzle, each of the at least one partition defining:
a central cavity configured to define the fluid departing the surface into a first vortex;
a side cavity laterally adjacent the central cavity configured to define fluid escaping from the central cavity into a second vortex; and
wherein the first vortex and the second vortex fluidly interact with one another and are each in contact with the surface.

2. The cleaner of claim 1, wherein the fluid nozzle propels the fluid substantially perpendicular onto the surface.

3. The cleaner of claim 1, wherein the side cavity is coupled to a vacuum to remove at least part of the escaping fluid to remove particles.

4. The cleaner of claim 3, wherein a vacuum volume is greater than ninety percent (90%) of a fluid nozzle delivery volume.

5. The cleaner of claim 1, wherein each of the at least one partition is distanced from the surface by a partition distance, and the fluid nozzle is distanced from the surface by a nozzle standoff distance.

6. The cleaner of claim 5, wherein the partition distance is less than a distance from a centerline of the fluid nozzle to each of the at least one partition.

7. The cleaner of claim 5, wherein the nozzle standoff distance is no less than 1.2 times the partition distance and no greater than twice the partition distance.

8. The cleaner of claim 5, wherein a Reynolds number based on a fluid velocity as a reference velocity and the partition distance as a reference distance is no less than 7,500 and no greater than 20,000.

9. The cleaner of claim 5, wherein a distance from a centerline of the fluid nozzle to each of the at least one partition is greater than five times an inner diameter of the fluid nozzle.

10. The cleaner of claim 5, wherein a ratio of a lateral distance of the side cavity to the partition distance is greater than 10, and wherein the lateral distance of the side cavity is measured between a partition and a vacuum entry.

11. The cleaner of claim 1, wherein the central cavity forms an angle with the horizontal at each of the at least one partition of greater than 0° and less than 65°, and the side cavity forms an angle with the horizontal at each partition of greater than 20° and less than 90°.

12. The cleaner of claim 1, wherein the central cavity forms an angle relative to a vertical edge of the fluid nozzle of no less than 80° and no greater than 135°.

13. The cleaner of claim 1, wherein the second vortex has a larger diameter and less energy than the first vortex.

14. The cleaner of claim 1, wherein the cleaner is placed above the surface.

15. The cleaner of claim 1, wherein the central cavity and the side cavity both extend in a planar fashion.

16. A cleaner for removing particles from a surface by propelling a fluid against the surface, the cleaner comprising:
means for delivering a fluid under pressure to an area on the surface;
means for forming fluid departing the surface into at least one first vortex adjacent the area and in contact with the surface, and at least one second vortex adjacent each of the at least one first vortex and in contact with the surface; and
means for evacuating particles by removing a part of each of the at least one second vortex.

17. The cleaner of claim 16, wherein the at least one first vortex and the at least one second vortex are counter-rotating relative to one another.

18. The cleaner of claim 16, wherein each of the at least one second vortex has a larger diameter and less energy than a respective first vortex.

19. A method for removing particles from a surface by propelling a fluid against the surface, the method comprising the steps of:

delivering a fluid under pressure to an area on the surface;

forming fluid departing the surface into at least one first vortex adjacent the area and in contact with the surface, and at least one second vortex adjacent each of the at least one first vortex and in contact with the surface; and removing particles by removing at least part of each of the at least one second vortex.

20. The method of claim 19, wherein the forming step includes forming each of the at least one second vortex to have a larger diameter and less energy than a respective first vortex.

* * * * *